(12) United States Patent
Okuno et al.

(10) Patent No.: US 8,157,496 B2
(45) Date of Patent: Apr. 17, 2012

(54) SUBSTRATE PROCESSING APPARATUS AND SUBSTRATE TRANSFER METHOD

(75) Inventors: Eiji Okuno, Kyoto (JP); Takashi Hara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 789 days.

(21) Appl. No.: 11/469,700

(22) Filed: Sep. 1, 2006

(65) Prior Publication Data
US 2007/0081881 A1      Apr. 12, 2007

(30) Foreign Application Priority Data
Sep. 27, 2005   (JP) ................. 2005-280612

(51) Int. Cl.
*B65G 1/00* (2006.01)
(52) U.S. Cl. ............ 414/222.01; 414/808; 414/937
(58) Field of Classification Search ............ 414/222.01, 414/304, 305, 744.1, 808, 937, 939
See application file for complete search history.

(56) References Cited

U.S. PATENT DOCUMENTS

| | | | |
|---|---|---|---|
| 6,945,258 B2* | 9/2005 | Itou .............................. | 134/56 R |
| 6,979,165 B2* | 12/2005 | Larson et al. ............ | 414/226.05 |
| 6,981,808 B2* | 1/2006 | Miyata et al. ................. | 396/611 |
| 7,059,817 B2* | 6/2006 | Sieradzki et al. ............. | 414/217 |
| 7,357,842 B2* | 4/2008 | Ishikawa et al. .............. | 118/503 |
| 2002/0092368 A1 | 7/2002 | Nishimura et al. | |
| 2002/0150459 A1* | 10/2002 | Fujii et al. .................. | 414/744.5 |
| 2004/0026036 A1* | 2/2004 | Shimeno et al. ......... | 156/345.31 |

FOREIGN PATENT DOCUMENTS
JP      2002-217266      8/2002

OTHER PUBLICATIONS

Chinese Office Action issued on Dec. 7, 2007 in connection with Chinese Patent Application No. 200610127474.8.
Japanese Office Action issued Oct. 28, 2010 in connection with corresponding Japanese Patent Application No. 2005-280612.

* cited by examiner

*Primary Examiner* — Joshua Rudawitz
(74) *Attorney, Agent, or Firm* — Ostrolenk Faber LLP

(57) ABSTRACT

A substrate processing apparatus includes a cassette placing table; a first transfer mechanism having a first substrate holding hand capable of advancing/retreating and using this first substrate holding hand to transfer a substrate with respect to the cassette; a substrate processing unit for executing a predetermined process on a substrate; a second transfer mechanism having a second substrate holding hand capable of advancing/retreating and pivotable at a vertical axis, and using the second substrate holding hand to transfer a substrate with respect to the first transfer mechanism and the substrate processing unit; a moving mechanism for moving the first transfer mechanism in an arrangement direction of the cassettes; and a control unit for controlling transfer of a substrate between the first transfer mechanism and the second transfer mechanism in a position where the first transfer mechanism is opposed to a cassette.

7 Claims, 7 Drawing Sheets

SUBSTRATE PROCESSING APPARATUS AND SUBSTRATE TRANSFER METHOD

BACKGROUND OF THE INVENTION

1. Field of the Invention

The present invention relates to a substrate processing apparatus for and a substrate transfer method of transferring a substrate between a cassette which houses a substrate and a substrate processing unit which is adapted to execute a predetermined process on a substrate. Examples of the substrate to be transferred include a semiconductor wafer, a substrate for a liquid crystal display device, a substrate for a plasma display, a substrate for an FED (Field Emission Display), a substrate for an optical disk, a substrate for a magnetic disk, a substrate for a photomagnetic disk, a substrate for a photomask and the like.

2. Description of Related Art

A substrate processing apparatus for processing a substrate W such as a semiconductor wafer, a glass substrate for a liquid crystal display panel or the like comprises, for example, a substrate processing module 201 and an indexer module 202 connected thereto, as shown in FIG. 7.

The substrate processing module 201 comprises four processing units 203 placed in a planar arrangement, and a main transfer robot 204 disposed at the center of these processing units 203 as surrounded thereby. The main transfer robot 204 executes a substrate carrying-in/carrying-out operation for carrying an unprocessed substrate W in the processing unit 203 and carrying out a processed substrate W from the processing unit 203.

On the other hand, the indexer module 202 comprises a cassette placing table 206 on which a cassette 205 capable of housing a plurality of substrates W is placed, an indexer robot 207, and a moving mechanism 208 which moves the indexer robot 207 in an arrangement direction of the cassette 205. The indexer robot 207 has access to the cassette 205 placed on the cassette placing table 206 to carry in/out a substrate and also receives/transfers a substrate from/to the main transfer robot 204.

Transfer of a substrate W between the indexer robot 207 and the main transfer robot 204 is conducted in a state that the indexer robot 207 is located in a substrate transfer position P1 where the indexer robot 207 is closest in distance to the main transfer robot 204.

The indexer robot 207 is moved to a position opposed to any of the cassettes 205 placed on the cassette placing table 206 by the moving mechanism 208, and then carries out one unprocessed substrate W from the cassette 205. After the carrying-out, the indexer robot 207 is moved to the substrate transfer position P1 by the moving mechanism 208, and then transfers the unprocessed substrate W to the main transfer robot 204. The main transfer robot 204 carries the unprocessed substrate W thus received from the indexer robot 207 in any of the processing units 203. On the other hand, the main transfer robot 204 takes out a processed substrate W from the processing unit 203 and transfers this processed substrate W to the indexer robot 207 located in the substrate transfer position P1. The indexer robot 207 is moved to a position opposed to any of the cassettes 205 placed on the cassette placing table 206 by the moving mechanism 208 and then houses the processed substrate W thus received from the main transfer robot 204 in the cassette 205.

In such substrate processing apparatus, transfer load on the indexer robot 207 is heavy, whereby the transfer operation thereof has caused lower throughput for the entire apparatus. More specifically, the indexer robot 207 has access to a plurality of cassettes 205 placed on the cassette placing table 206 for carrying-in/carrying-out of a substrate W and also executes a transfer operation of the substrate W to the main transfer robot 204.

The transfer of a substrate W between the indexer robot 207 and the main transfer robot 204 is conducted in the state the indexer robot 207 is position-controlled in the substrate transfer position P1. Therefore, the indexer robot 207 must be moved between the position opposed to a cassette 205 for carrying-in/carrying-out of a substrate W and the substrate transfer position P1.

Accordingly, transfer load on the indexer robot 207 is heavy, whereby the transfer operation thereof has caused lower throughput for the entire apparatus.

SUMMARY OF THE INVENTION

It is an object of the present invention to provide a substrate processing apparatus and a substrate transfer method, each of which is capable of improving the throughput of the entire apparatus, thereby enabling improvement in production efficiency.

The substrate processing apparatus of the present invention comprises: a cassette placing table on which a plurality of cassettes for each housing a substrate are placed in a predetermined arrangement direction; a first transfer mechanism having a first substrate holding hand which is capable of advancing and retreating with respect to a cassette placed on the cassette placing table, and using the first substrate holding hand to transfer a substrate with respect to the cassette; a substrate processing unit for executing a predetermined process on a substrate; a second transfer mechanism having a second substrate holding hand which is capable of advancing and retreating with respect to the first transfer mechanism and the substrate processing unit and which is pivotable about a vertical axis, and using the second substrate holding hand to transfer a substrate with respect to the first transfer mechanism and the substrate processing unit; a moving mechanism for moving the first transfer mechanism in the predetermined arrangement direction; and a control unit for controlling transfer of a substrate between the first transfer mechanism and the second transfer mechanism in a position where the first transfer mechanism is opposed to each of the plurality of cassettes.

According to the arrangement mentioned above, the first transfer mechanism can receive/transfer a substrate from/to the second transfer mechanism in a position opposed to each of the plurality of cassettes. That is, the first transfer mechanism can receive/transfer a substrate from/to the second transfer mechanism at a position accessible to each of the plurality of cassettes. Therefore, the first transfer mechanism need not be moved to the substrate transfer position where the first transfer mechanism is closest in distance to the second transfer mechanism. This can lighten the transfer load on the first transfer mechanism.

Further, the first transfer mechanism can transfer a substrate from/to the second transfer mechanism at a position where the first transfer mechanism has accessed a cassette immediately beforehand or at a position where the first transfer mechanism is to access a cassette immediately afterwards.

Thus, the movement of the first transfer mechanism can be suppressed. Accordingly, the transfer load on the first transfer mechanism can be lightened, thereby enabling improvement in the production efficiency of the substrate processing apparatus.

The first transfer mechanism may further include a first hand pivot mechanism for pivoting the first substrate holding hand to a posture opposed to a cassette placed on the cassette placing table and to a posture opposed to the second transfer mechanism. In this case, it is preferable that the control unit controls the first hand pivot mechanism, thereby controlling the first substrate holding hand to be in the posture opposed to the second transfer mechanism when a substrate is transferred between the first transfer mechanism and the second transfer mechanism.

According to the arrangement mentioned above, the first hand pivot mechanism controls the first transfer mechanism to be in the posture opposed to a cassette on the cassette placing table, thereby enabling the first transfer mechanism to carry a substrate in and out from the cassette thereon. In a position where the first transfer mechanism is opposed to each of the plurality of cassettes, the first hand pivot mechanism controls the first transfer mechanism to be in the posture opposed to the second transfer mechanism, thereby enabling transfer of a substrate between the first transfer mechanism and the second transfer mechanism. Thus, the transfer therebetween can be smoothly conducted with a simple apparatus arrangement.

The control unit may control the first and second transfer mechanisms such that the substrate transfer therebetween is performed with both the first and second substrate holding hands being achieved.

The substrate processing unit is preferably disposed on a side opposite to the first transfer mechanism with respect to the second transfer mechanism. According to this arrangement, the second transfer mechanism can be disposed between the first transfer mechanism and the substrate processing unit. This enables reduction in the distance between the first and the second transfer mechanisms. Therefore, for transfer of a substrate therebetween, the distance (stroke) in which the second substrate holding hand of the second transfer mechanism advances/retreats can be reduced. This simplifies the apparatus arrangement and achieves cost reduction.

The substrate processing apparatus may comprise a plurality of substrate processing units vertically laminated. This arrangement can reduce the installation area of the plurality of substrate processing units. Further, since the vertical lamination thereof can provide a space around the second transfer mechanism, the first transfer mechanism can be disposed in the vicinity of the second transfer mechanism, thereby enabling reduction in the distance between the first and the second transfer mechanisms. Thus, the first transfer mechanism can receive/transfer a substrate from/to the second transfer mechanism in a position opposed to each of the plurality of cassettes. That is, the first transfer mechanism can receive/transfer a substrate from/to the second transfer mechanism at a position accessible to each of the cassettes.

The vertical axis of the second transfer mechanism may be fixed in a predetermined position. This allows the first transfer mechanism to receive/transfer a substrate from/to the second transfer mechanism in which the pivot center of the second substrate holding hand is fixed, in a position opposed to each of the plurality of cassettes. That is, the first transfer mechanism can receive/transfer a substrate from/to the second transfer mechanism in which the pivot center thereof is fixed, at a position accessible to each of the cassettes.

The substrate transfer method of the present invention comprises: a first substrate transfer step of receiving and transferring a substrate from and to a predetermined cassette among a plurality of cassettes for each housing a substrate, by advancing and retreating a first substrate holding hand provided in a first transfer mechanism to and from the predetermined cassette; a second substrate transfer step of receiving and transferring a substrate from and to a substrate processing unit for executing a predetermined process on a substrate, by advancing and retreating a second substrate holding hand provided in a second transfer mechanism to and from the substrate processing unit; and a third substrate transfer step of receiving and transferring a substrate between the first substrate holding hand and the second substrate holding hand, with the second substrate holding hand opposed to the first transfer mechanism located in a position opposed to the predetermined cassette among the plurality of cassettes, by pivoting the second substrate holding hand of the second transfer mechanism about a vertical axis.

According to this method, transfer load on the first substrate holding hand can be lightened. Thus, the throughput of the entire apparatus can be improved, thereby enabling improvement in production efficiency of the substrate processing.

The foregoing and other elements, features, steps, characteristics and advantages of the present invention will become more apparent from the following detailed description of the preferred embodiments with reference to the attached drawings.

DETAILED DESCRIPTION OF PREFERRED EMBODIMENTS

Figure 1:
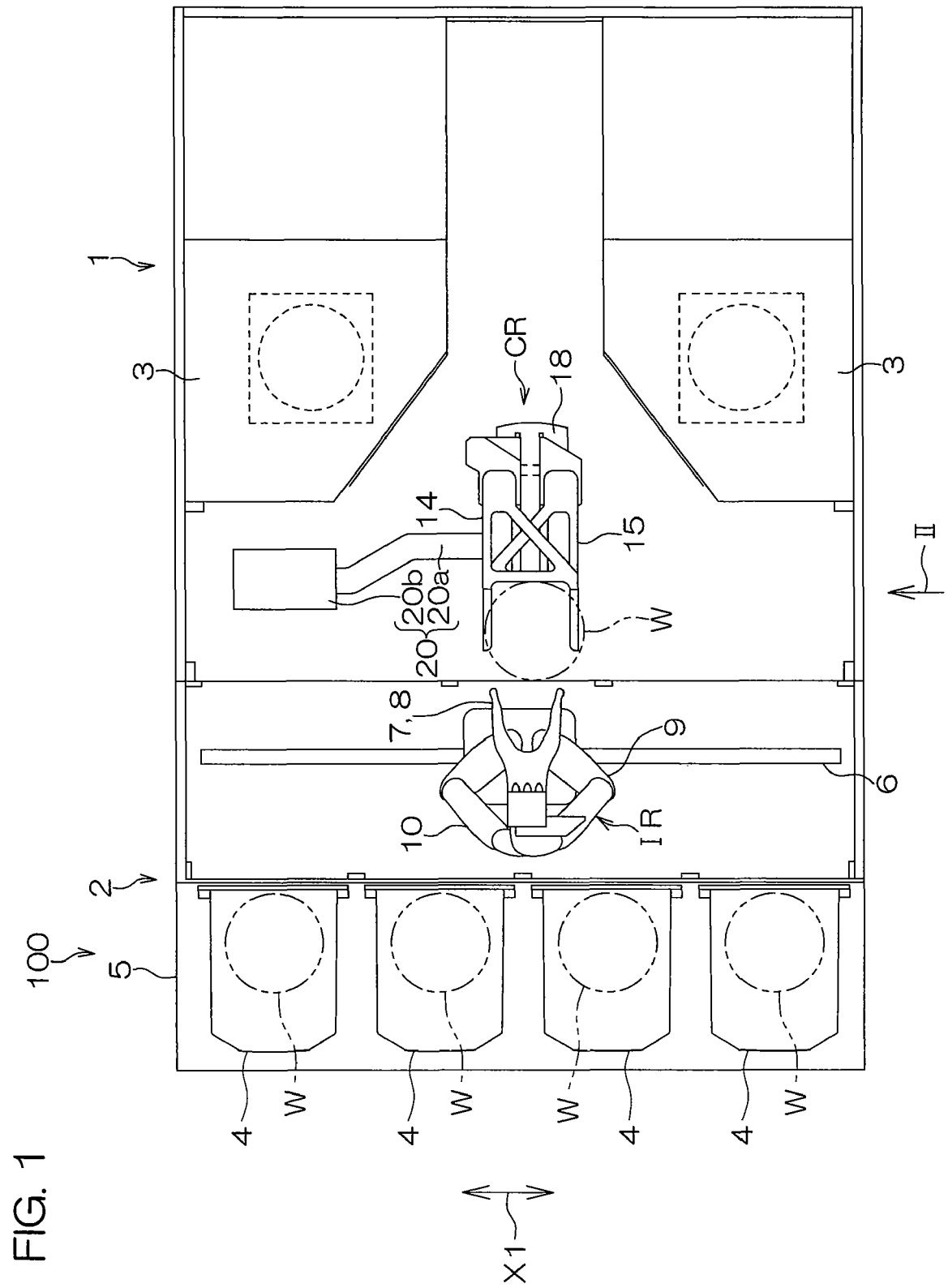
FIG. 1 is a schematic plan view illustrating a layout of a substrate processing apparatus to which an embodiment of the present invention is applied.
Figure 2:
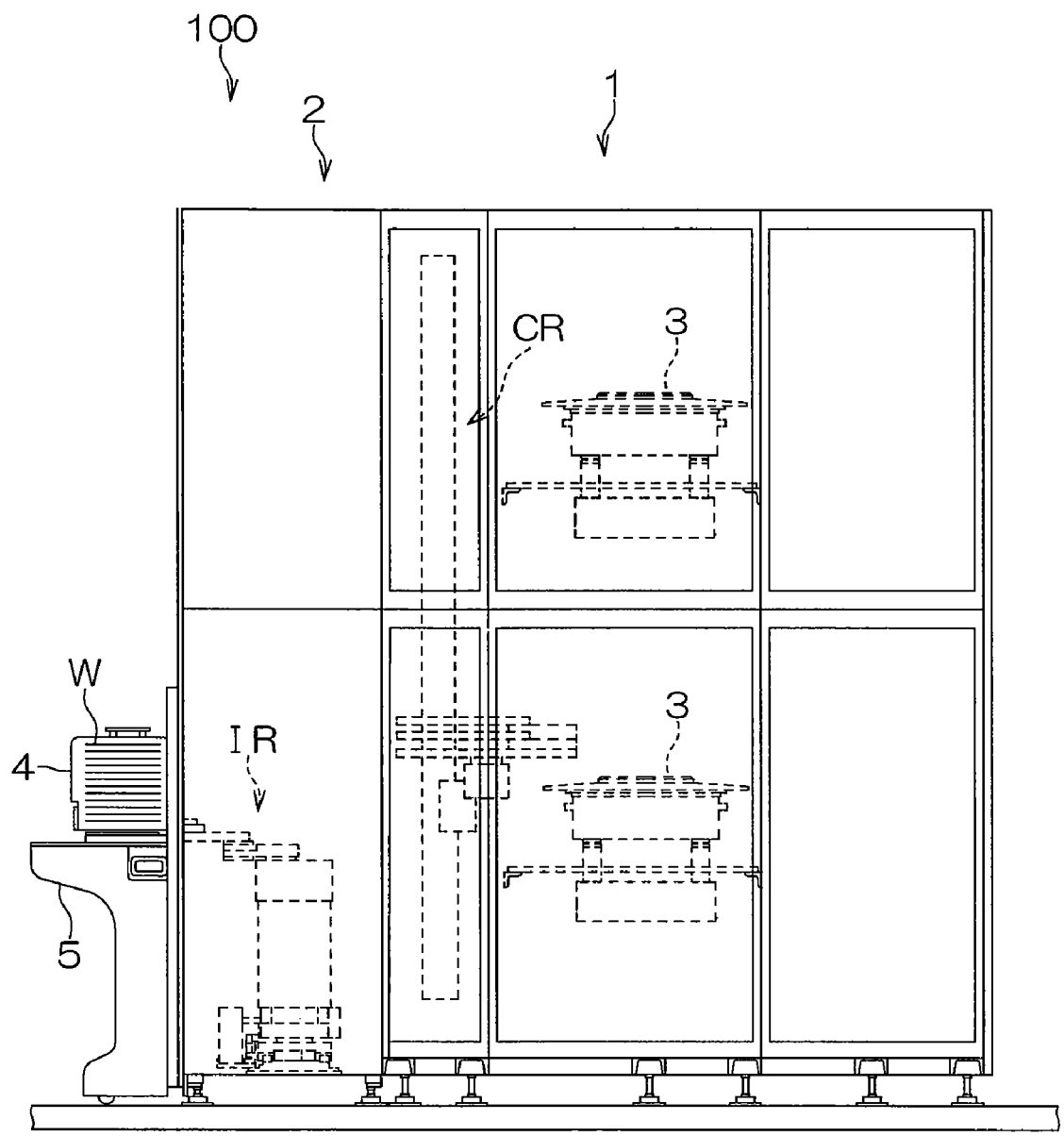
FIG. 2 is a schematic elevational view of the substrate processing apparatus.

FIG. 1 is a schematic plan view illustrating a layout of a substrate processing apparatus to which an embodiment of the present invention is applied, and FIG. 2 is a schematic elevational view taken along the direction of an arrow II of the substrate processing apparatus in FIG. 1. This substrate processing apparatus 100 is adapted to execute a variety of processings such as a washing processing, an etching processing and the like, on a substrate W such as a semiconductor wafer. This substrate processing apparatus 100 comprises a substrate processing module 1 and an indexer module 2 connected thereto.

The substrate processing module 1 comprises a plurality of processing units 3 (substrate processing unit) for executing a variety of processings such as a washing processing, an etching processing and the like on a substrate W and a main transfer robot CR (second transfer mechanism). The main transfer robot CR conducts a carrying-in operation for carrying an unprocessed substrate W in the processing unit 3 and a carrying-out operation for carrying out a processed substrate W from the processing unit 3, and receives/transfers a substrate W from/to the indexer module 2.

The indexer module 2 comprises a cassette placing table 5 on which a plurality of cassettes 4 each capable of housing a plurality of substrates W is placed in a state of being arranged in a predetermined arrangement direction X1 (hereinafter referred to as "cassette arrangement direction X1"); an indexer robot IR (first transfer mechanism); and a moving mechanism 6 which moves the indexer robot IR in the cassette arrangement direction X1. The indexer robot IR conducts a carrying-in operation for carrying a processed substrate W in a cassette 4 placed on the cassette placing table 5 and a carrying-out operation for carrying out an unprocessed substrate W from the cassette 4, and receives/transfers a substrate W from/to the main transfer robot CR.

The moving mechanism 6 includes, for example, a linear guide (not shown) which is disposed as extending in a direction of moving the indexer robot IR (i.e., in the cassette arrangement direction X1) so as to guide the movement, and a drive mechanism (not shown) such as a belt mechanism or a ball screw mechanism which drive-controls the moving operation of the indexer robot IR along the linear guide.

Four processing units 3 are provided in this embodiment. These processing units 3 are of a two-layer construction with each unit vertically laminated, and a pair of processing units 3 is disposed each in an upper side layer and a lower side layer. The pair of processing units 3 in each layer is arranged in parallel to the cassette arrangement direction X1 and disposed a predetermined distance away therefrom. Further, the processing units 3 are disposed a predetermined distance away from the cassette placing table 5 in a horizontal direction which is perpendicular to the cassette arrangement direction X1.

The indexer robot IR and the main transfer robot CR are disposed between the processing units 3 and the cassette placing table 5. More specifically, the indexer robot IR is disposed therebetween but closer to the cassette placing table 5. The indexer robot IR is horizontally moved in the cassette arrangement direction X1 by the moving mechanism 6, and can be located in opposed relation to each cassette 4. The main transfer robot CR is located between the cassette placing table 5 and the processing units 3 but closer to the processing units 3, and disposed between the pair of processing units 3 in each of the upper and lower side layers. Specifically, the indexer robot IR and the main transfer robot CR are disposed adjacent to each other when viewed from the front direction of the substrate processing apparatus 100 (taken along the direction of the arrow II).

The indexer robot IR comprises a first upper arm 9 having a first upper hand 7 attached to a distal end thereof, and a first lower arm 10 a first lower hand 8 attached to a distal end thereof. The main transfer robot CR comprises a second upper hand 14 and a second lower hand 15. The first upper hand 7 and the first lower hand 8 correspond to the first substrate holding hand of the present invention. The second upper hand 14 and the second lower hand 15 correspond to the second substrate holding hand of the present invention.

Figure 3:
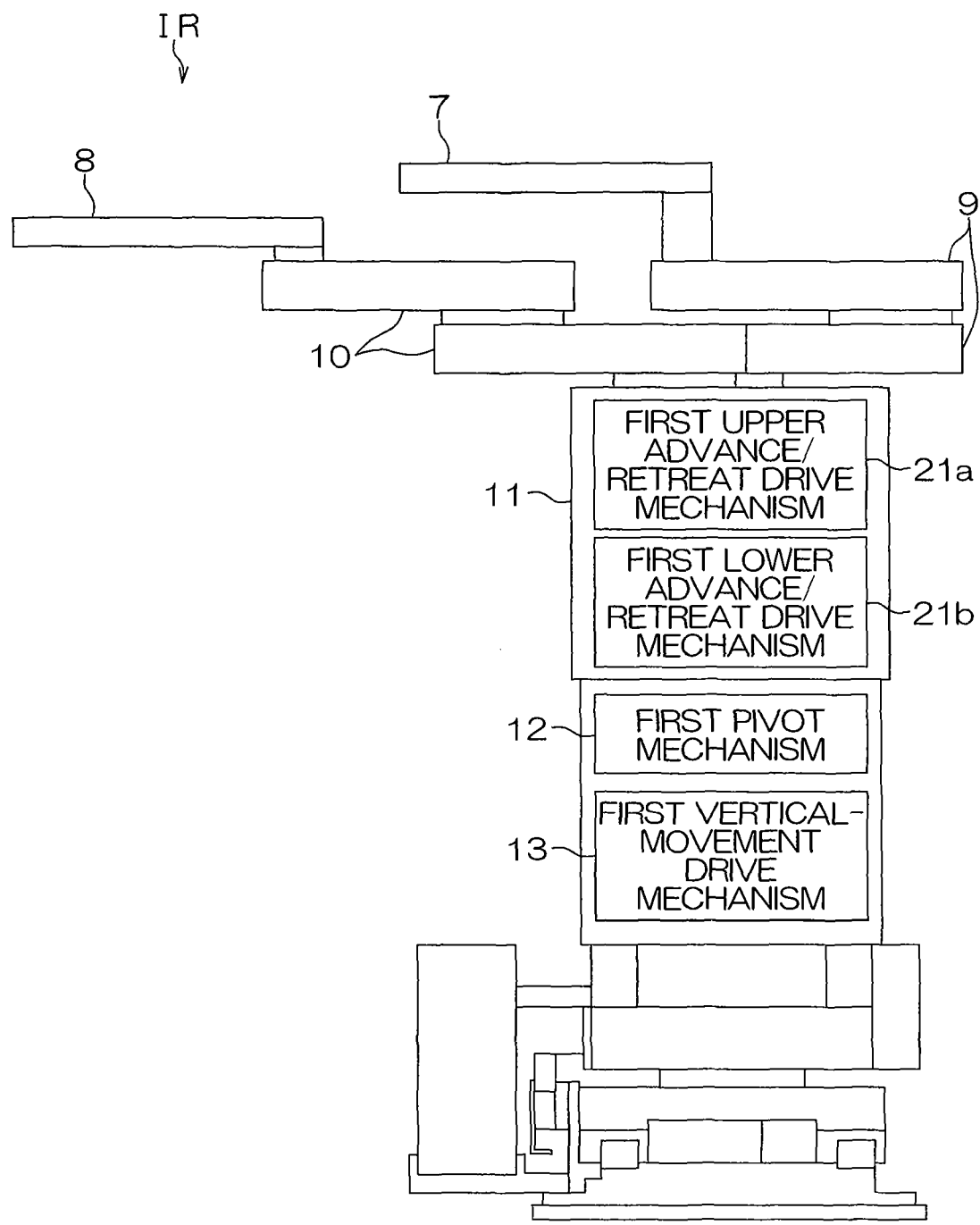
FIG. 3 is a side view schematically illustrating an indexer robot viewed from the front direction of the substrate processing apparatus.

FIG. 3 is a side view schematically illustrating an indexer robot viewed from the front direction of the substrate processing apparatus. The indexer robot IR comprises the first upper arm 9, the first lower arm 10, a first base stand 11 which holds these arms, a first pivot mechanism 12 (first hand pivot mechanism) for rotating the first base stand 11 about a vertical axis, a first vertical-movement drive mechanism 13 for raising and lowering the first base stand 11 in the vertical direction, a first upper advance/retreat drive mechanism 21a for horizontally advancing/retreating the first upper hand 7 by bending/stretching the first upper arm 9, and a first lower advance/retreat drive mechanism 21b for horizontally advancing/retreating the first lower hand 8 by bending/stretching the first lower arm 10.

Each of the first upper arm 9 and the first lower arm 10 is a multi-joint type bending/stretching arm, having the first upper hand 7 and the first lower hand 8 attached to respective one ends thereof, and the respective other ends commonly attached to the first base stand 11.

The first upper advance/retreat drive mechanism 21a is included in the first base stand 11 and connected to the first upper arm 9. The first upper arm 9 is bent/stretched by the first upper advance/retreat drive mechanism 21a, whereby the first upper hand 7 is horizontally advanced/retreated. The first lower advance/retreat drive mechanism 21b is included in the first base stand 11 and connected to the first lower arm 10. The first lower arm 10 is bent/stretched by the first lower advance/retreat drive mechanism 21b, whereby the first lower hand 8 is horizontally advanced/retreated. The first upper arm 9 and the first lower arm 10 are mutually independently bent/stretched by the first upper advance/retreat drive mechanism 21a and the first lower advance/retreat drive mechanism 21b, respectively, whereby the first upper hand 7 and the first lower hand 8 is mutually independently advanced/retreated.

Provision is made such that the first upper hand 7 attached to the first upper arm 9 advances/retreats above the first lower hand 8 attached to the first lower arm 10 and that the first upper hand 7 and the first lower hand 8 are in the same position when viewed from the vertical direction at the initial state where the first upper arm 9 and the first lower arm 10 are retreated above the first base stand 11.

The first pivot mechanism 12 rotates the first base stand 11 by which the first upper arm 9 and the first lower arm 10 are held about the vertical axis. The first vertical-movement drive mechanism 13 raises and lowers the first base stand 11 in the vertical direction. Thus, the indexer robot IR can be in a posture such that the first upper hand 7 and the first lower hand 8 attached to the first upper arm 9 and the first lower arm 10 respectively are opposed to the main transfer robot CR, thus receiving/transferring a substrate W from/to the main transfer robot CR in this posture. Further, the first pivot mechanism 12, the first vertical-movement drive mechanism 13 and the moving mechanism 6 can put the indexer robot IR in a posture such that each of the first upper hand 7 and the first lower hand 8 is opposed to a cassette 4 placed on the cassette placing table 5, so that the indexer robot IR can carry a substrate W in and out from the cassette 4 in this posture.

Figure 4:
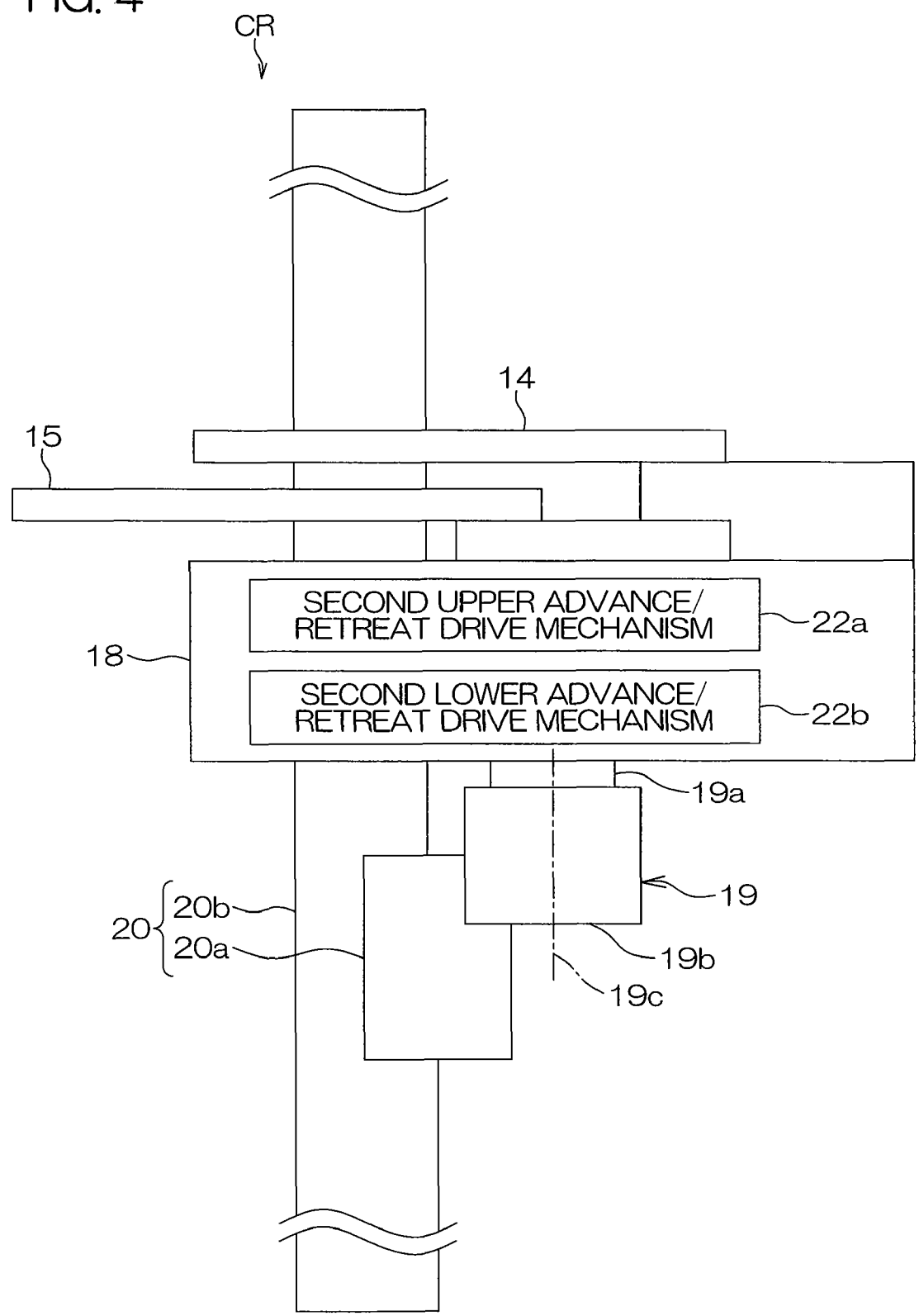
FIG. 4 is a side view schematically illustrating a main transfer robot viewed from the front direction of the substrate processing apparatus.

FIG. 4 is a side view schematically illustrating a main transfer robot viewed from the front direction of the substrate processing apparatus. The main transfer robot CR comprises the second upper hand 14; the second lower hand 15; a second base stand 18 by which these hands are held so as to be capable of linearly advancing/retreating; a second pivot mechanism 19 for rotating the second base stand 18 about a vertical axis 19c; a second vertical-movement drive mechanism 20 for raising and lowering the second base stand 18 in the vertical direction; a second upper advance/retreat drive mechanism 22a for horizontally advancing/retreating the second upper hand 14; and a second lower advance/retreat drive mechanism 22b for horizontally advancing/retreating the second lower hand 15.

The second pivot mechanism 19 includes a rotation shaft 19a having the vertical axis 19c at the center thereof, and a pivot drive unit 19b having a drive source (not shown) included therein. The rotation shaft 19a has one end fixed to the lower portion of the second base stand 18 and the other end rotatably held by the pivot drive unit 19b. The drive of the drive source in the pivot drive unit 19b rotates the rotation shaft 19a about the vertical axis 19c.

Thus, the second base stand 18 fixed to one end of the rotation shaft 19*a*, the second upper hand 14, and the second lower hand 15 are rotated about the vertical axis 19*c* with the rotation shaft 19*a* as the center thereof. At least during substrate processing operation, the entire main transfer robot CR does not move within the apparatus, and the vertical axis 19*c* which is a rotation center of the hands 14, 15 is held in a predetermined fixing position.

The second vertical-movement drive mechanism 20 includes an arm-like vertical-movement member 20*a* and a vertical-movement drive unit 20*b* having a drive source (not shown) included therein. The vertical-movement member 20*a* has one end fixed to the pivot drive unit 19*b* and the other end vertically movably held by the vertical-movement drive unit 20*b*. The drive of the drive source in the vertical-movement drive unit 20*b* raises and lowers the vertical-movement member 20*a* in the vertical direction. This raises and lowers the second pivot mechanism 19 which includes the pivot drive unit 19*b* fixed to the vertical-movement member 20*a*, the second base stand 18, the second upper hand 14 and the second lower hand 15 in the vertical direction.

The second upper advance/retreat drive mechanism 22*a* is included in the second base stand 18 and connected to the second upper hand 14. The second upper hand 14 is horizontally advanced/retreated by the second upper advance/retreat drive mechanism 22*a*. The second lower advance/retreat drive mechanism 22*b* is included in the second base stand 18 and connected to the second lower hand 15. The second lower hand 15 is horizontally advanced/retreated by the second lower advance/retreat drive mechanism 22*b*. The second upper hand 14 and the second lower hand 15 are mutually independently advanced/retreated by the second upper advance/retreat drive mechanism 22*a* and the second lower advance/retreat drive mechanism 22*b*, respectively.

Provision is made such that the second upper hand 14 advances/retreats above the second lower hand 15 and that the second upper hand 14 and the second lower hand 15 are in the same position when viewed from the vertical direction at the initial state where these hands are retreated above the second base stand 18.

The second pivot mechanism 19 rotates the second base stand 18 by which the second upper hand 14 and the second lower hand 15 are held, about the vertical axis 19*c*. The second vertical-movement drive mechanism 20 raises and lowers the second base stand 18 in the vertical direction. Thus, the main transfer robot CR can be in a posture such that each of the second upper hand 14 and the second lower hand 15 is opposed to any of the processing units 3, thus carrying a substrate Win and out from the processing unit 3 in this posture. Further, the main transfer robot CR can be in a posture such that each of these hands is opposed to the indexer robot IR, thus transferring a substrate W from and to the indexer robot IR in this posture.

The main transfer robot CR is disposed in a position where the vertical axis 19*c* is between the cassette placing table 5 and the processing units 3 but closer to the processing units 3, and between the pair of the processing units 3 in each of the upper and lower side layers. Further, the main transfer robot CR is disposed such that horizontal distances between the vertical axis 19*c* and each of the processing units 3 are equal.

As shown in FIG. 1, each of the first upper hand 7 and the first lower hand 8 of the indexer robot IR, and the second upper hand 14 and the second lower hand 15 of the main transfer robot CR is made, for example, in the form of a fork, so as to be able to hold a substrate W. The first upper hand 7 and the first lower hand 8 of the indexer robot IR are substantially the same in shape, and the second upper hand 14 and the second lower hand 15 of the main transfer robot CR are substantially the same in shape. The hands 7, 8 of the indexer robot IR and the hands 14, 15 of the main transfer robot CR are formed such that the hands 7, 8 mutually mesh with the hands 14, 15 in plan elevation so that these hands do not overlap each other, in order to prevent interference which may occur when a substrate W is received/transferred between the indexer robot IR and the main transfer robot CR. Thus, a substrate W can directly be received/transferred between the first and the second upper hands 7, 14, or between the first and the second lower hands 8, 15. That is, the first upper hand 7 and the first lower hand 8 of the indexer robot IR can receive a substrate W directly from the second upper hand 14 and the second lower hand 15 of the main transfer robot CR. Likewise, the hands 7, 8 of the indexer robot IR can transfer a substrate W directly to the hands 14, 15 of the main transfer robot CR.

Figure 5:
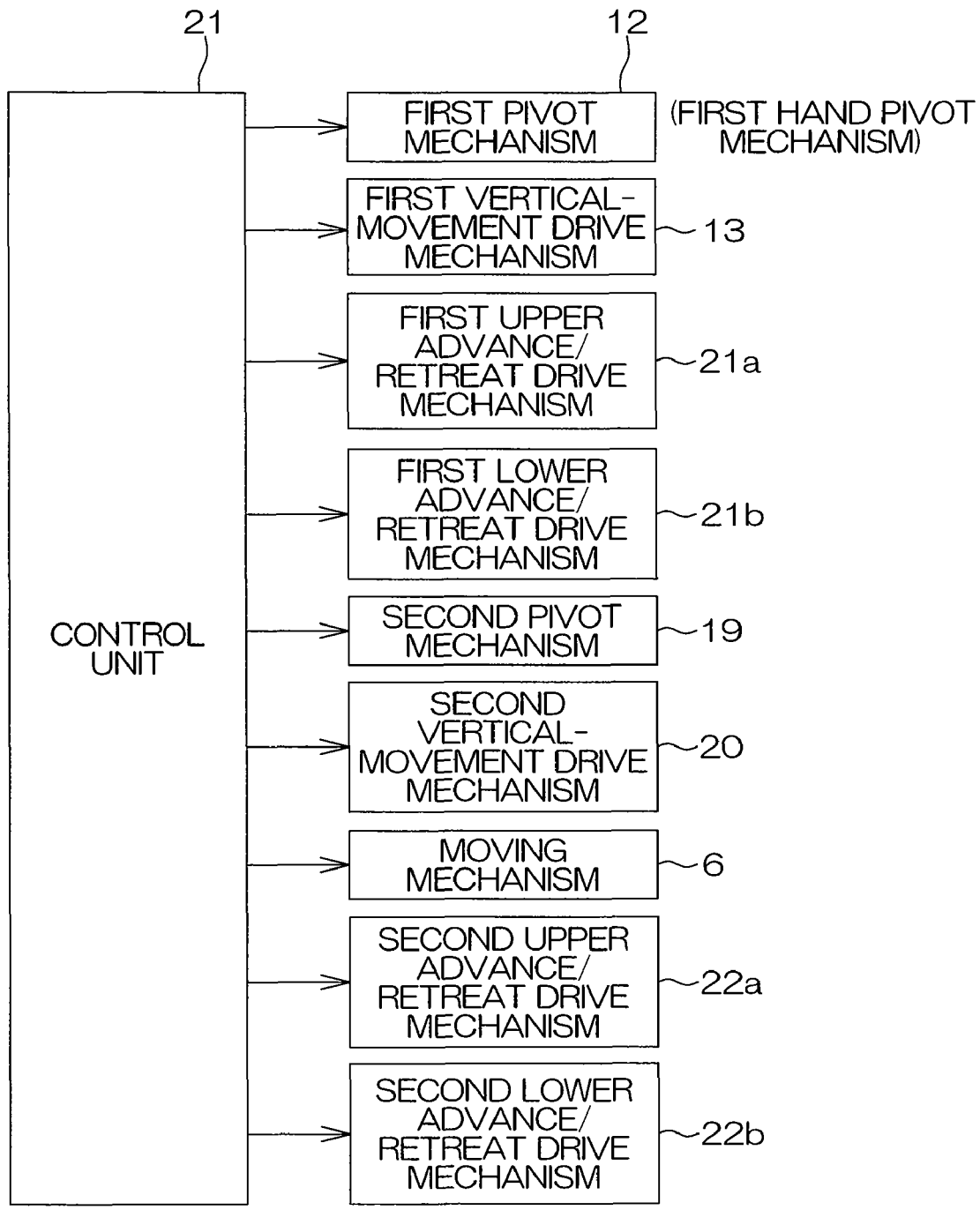
FIG. 5 is a block diagram illustrating a construction for control of the substrate processing apparatus.

FIG. 5 is a block diagram illustrating a construction for control of the substrate processing apparatus. The substrate processing apparatus 100 comprises a control unit 21. The control unit 21 is adapted to control operations of the second pivot mechanism 19, the second vertical-movement drive mechanism 20, the second upper advance/retreat drive mechanism 22*a* and the second lower advance/retreat drive mechanism 22*b* in the substrate processing module 1. Further, the control unit 21 is adapted to control operations of the first pivot mechanism 12, the first vertical-movement drive mechanism 13, the first upper advance/retreat drive mechanism 21*a*, the first lower advance/retreat drive mechanism 21*b* and the moving mechanism 6 in the indexer module 2.

Next, transfer of a substrate W between the main transfer robot CR and the indexer robot IR will be specifically described.

FIGS. 6(*a*) to 6(*d*) are schematic diagrams for explaining an example of a substrate transfer sequence. Transfer of a substrate W between the indexer robot IR and the main transfer robot CR is conducted in a position where the indexer robot IR is opposed to each of a plurality of cassettes 4. That is, the indexer robot IR receives/transfers a substrate W from/to the main transfer robot CR at a position accessible to each of the plurality of cassettes 4.

The indexer robot IR is controlled so as to hold an unprocessed substrate W with the first lower hand 8 and to hold a processed substrate W with the first upper hand 7, thus transferring these substrates W. Likewise, the main transfer robot CR is controlled so as to hold an unprocessed substrate W with the second lower hand 15 and to hold a processed substrate W with the second upper hand 14, thus transferring these substrates W. The transfer of the substrates W between the indexer robot IR and the main transfer robot CR is operated so as to exchange the unprocessed substrate W with the processed substrate W. Specifically, the indexer robot IR transfers the unprocessed substrate W to the main transfer robot CR, and the main transfer robot CR transfers the processed substrate W to the indexer robot IR.

The indexer robot IR which has received a processed substrate W has access to any of the cassettes 4 placed on the cassette placing table 5 to carry out an unprocessed substrate W from the cassette 4 and to carry the processed substrate W therein. Of course, the indexer robot IR may conduct operations of carrying out an unprocessed substrate W from a cassette 4 and carrying a processed substrate W in a different cassette 4.

On the other hand, the main transfer robot CR which has received an unprocessed substrate W has access to any of the plurality of processing units 3 to carry out a processed substrate W from the processing unit 3, and thereafter, carry an unprocessed substrate W in the processing unit 3. Of course, if there is no processed substrate W in a processing unit 3, only the operation of carrying an unprocessed substrate W in is conducted. If there is no unprocessed substrate W to be carried in the processing unit 3, only the operation of carrying out a processed substrate W is conducted.

Figure 6A:
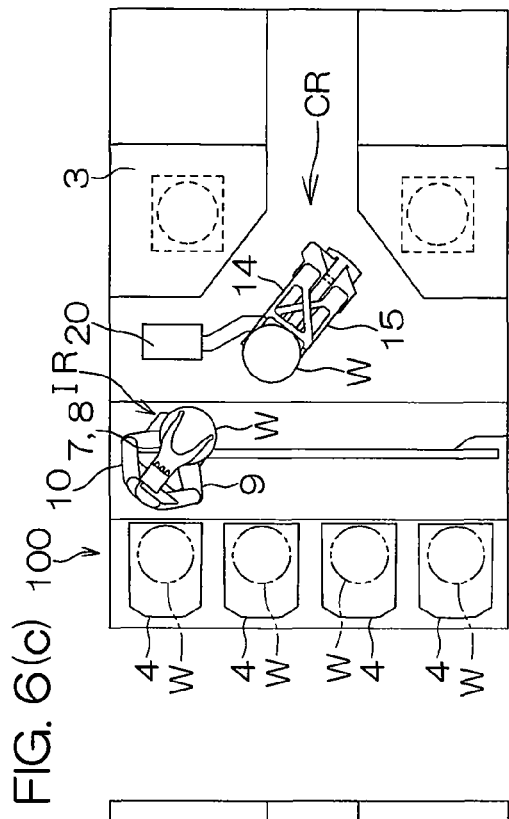
FIGS. 6(a)-6(d) are schematic diagrams for explaining an example of a substrate transfer sequence.

The control unit 21 controls the first pivot mechanism 12, the first vertical-movement drive mechanism 13, the first upper advance/retreat drive mechanism 21a, the first lower advance/retreat drive mechanism 21b and the moving mechanism 6, so as that the indexer robot IR carries a substrate W in and out from a cassette 4 and also receives/transfers a substrate W from/to the main transfer robot CR. More specifically, the control unit 21 controls the first vertical-movement drive mechanism 13 and the moving mechanism 6 to put the indexer robot IR in a posture opposed to a predetermined cassette 4, as shown in FIG. 6(a). That is, the first upper hand 7 attached to the first upper arm 9 faces the cassette 4. Then, the control unit 21 controls the first upper advance/retreat drive mechanism 21a to advance the first upper hand 7 which has previously held a processed substrate W to a cassette 4. Specifically, the first upper arm 9 is stretched, so that the first upper hand 7 is horizontally moved to the cassette 4.

Subsequently, the control unit 21 controls the first upper advance/retreat drive mechanism 21a and the first vertical-movement drive mechanism 13 to move the first upper hand 7 to a slightly lower position. This allows the substrate W to be placed in the cassette 4, and thereafter, the first upper arm 9 is retreated. That is, after the substrate W has been transferred to the cassette 4, the first upper arm 9 is contracted, so that the first upper hand 7 is horizontally moved toward a center portion of the first base stand 11 with maintaining the horizontal posture. This returns the first upper arm 9 to its initial position. Thus, the processed substrate W held by the first upper hand 7 is transferred to the cassette 4, whereby the indexer robot IR can carry the substrate W in the cassette 4.

Figure 6B:
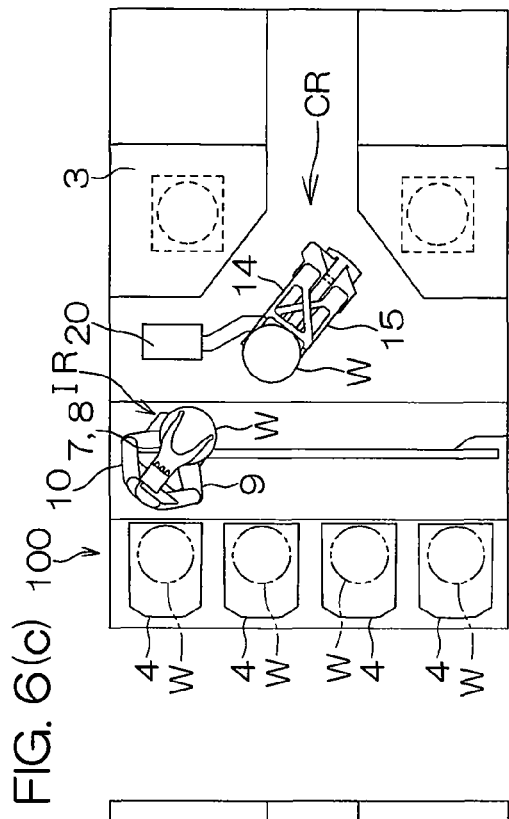

Next, the control unit 21 controls the first vertical-movement drive mechanism 13 and the moving mechanism 6 to move the indexer robot IR to a position opposed to the cassette 4 in which the substrate W has been carried or a different cassette 4, as shown in FIG. 6(b). Thus, the first lower hand 8 attached to the first lower arm 10 is put in a posture opposed to the cassette 4. The control unit 21 controls the first lower advance/retreat drive mechanism 21b and the first vertical-movement drive mechanism 13 to advance the first lower hand 8 to the cassette 4. Specifically, the first lower arm 10 is stretched, so that the first lower hand 8 is horizontally moved to a position slightly lower than a substrate W housed in the cassette 4. Further, the control unit 21 controls the first lower advance/retreat drive mechanism 21b and the first vertical-movement drive mechanism 13 to move the first lower hand 8 to a slightly upper position. This allows the first lower hand 8 to hold the substrate W, and thereafter, the first lower arm 10 is retreated. Thus, the unprocessed substrate W in the cassette 4 is transferred to the first lower hand 8, whereby the indexer robot IR can carry out the substrate W from the cassette 4. FIG. 6(b) shows that the first lower hand 8 is holding a substrate W.

Accordingly, there is conducted the first substrate transfer step of receiving/transferring a substrate W from/to a cassette 4 by advancing/retreating the first upper hand 7 and the first lower hand 8 to the cassette 4.

Figure 6C:
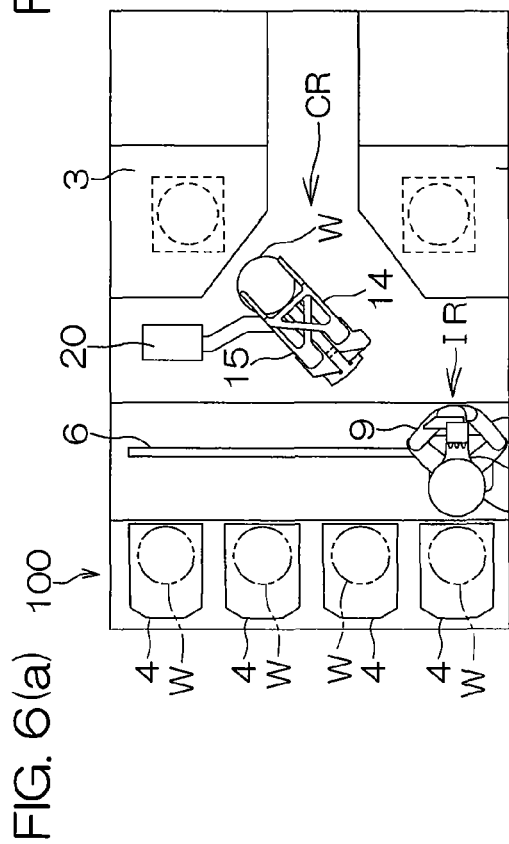
Figure 6D:
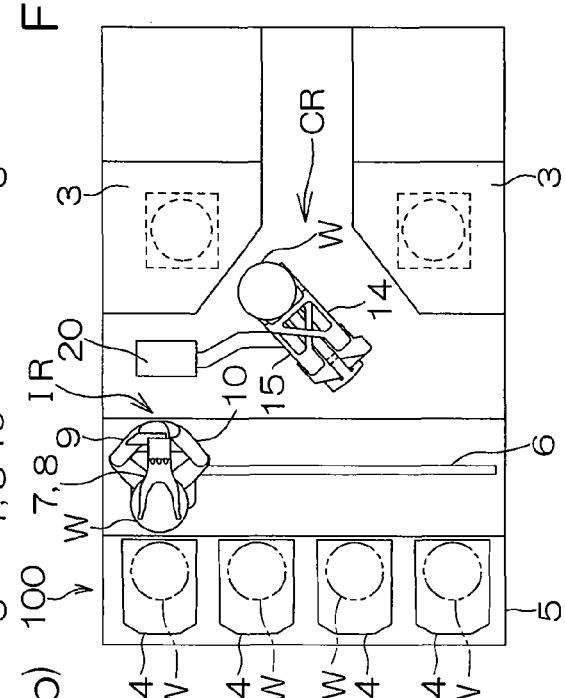
Figure 7:
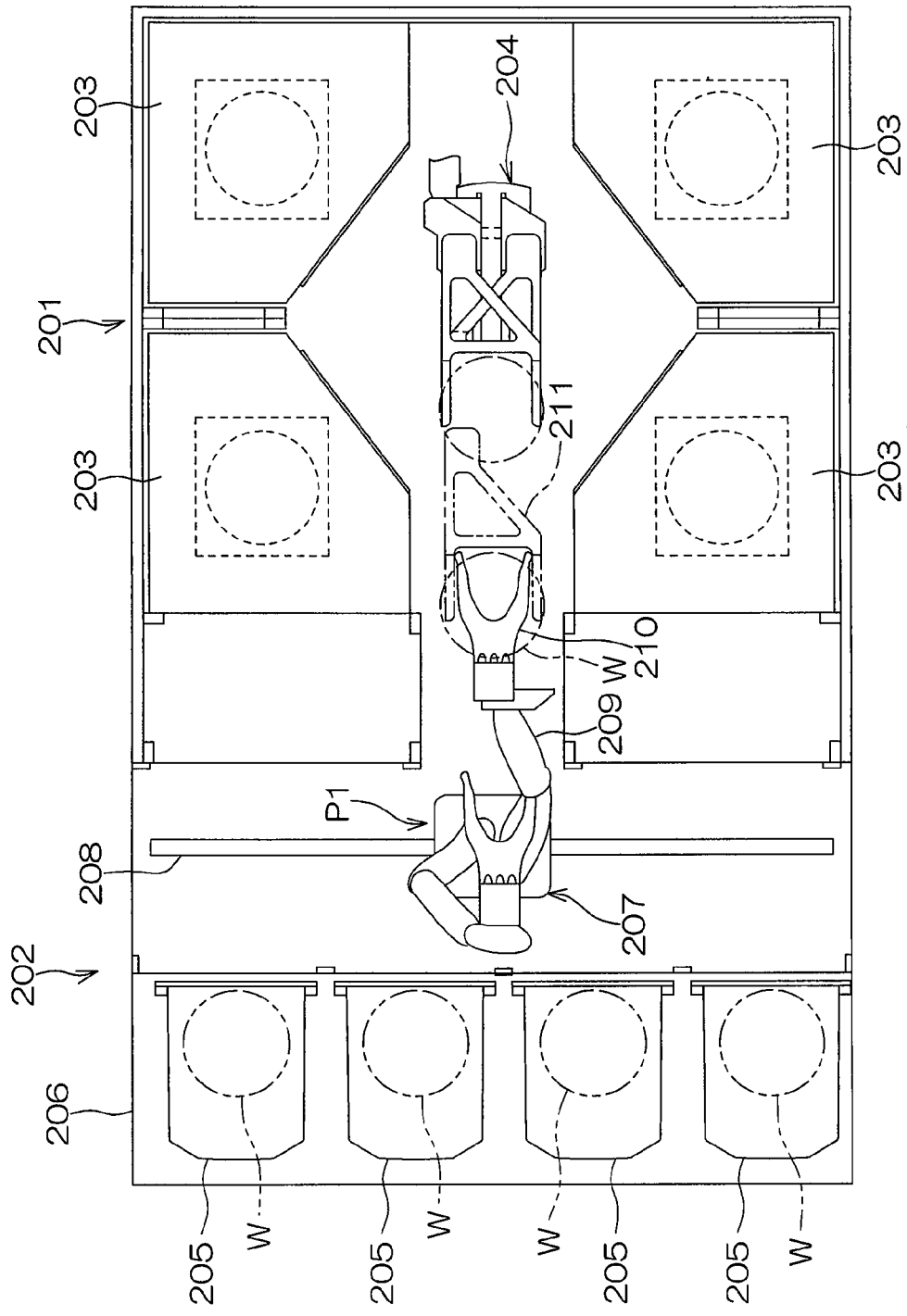
FIG. 7 is a schematic plan view illustrating a layout of a conventional substrate processing apparatus.

Next, the control unit 21 controls the first pivot mechanism 12 and the first vertical-movement drive mechanism 13 to put the indexer robot IR in a posture such that each of the first upper hand 7 and the first lower hand 8 is opposed to the main transfer robot CR, in the position opposed to the cassette 4 from which the indexer robot IR has carried the substrate W out, as shown in FIG. 6(c). In this state, transfer of a substrate W between the indexer robot IR and the main transfer robot CR is conducted. After the transfer, the control unit 21 moves the indexer robot IR again to the position opposed to the predetermined cassette 4, so that the carrying-in/carrying-out operation of a substrate W with respect to a cassette 4 and the transfer of a substrate W between the indexer robot IR and the main transfer robot CR are repeated.

On the other hand, the control unit 21 controls the second pivot mechanism 19, the second vertical-movement drive mechanism 20, the second upper advance/retreat drive mechanism 22a and the second lower advance/retreat drive mechanism 22b, so as that the main transfer robot CR carries a substrate W in and out from a processing unit 3 and also receives/transfers a substrate W from/to the indexer robot IR. More specifically, the control unit 21 controls the second pivot mechanism 19 and the second vertical-movement drive mechanism 20 to put the main transfer robot CR in a posture opposed to any of the processing units 3, as shown in FIG. 6(a). That is, the second upper hand 14 faces a processed substrate W in the processing unit 3, and is moved so as to be located in a position slightly lower than the substrate W. Then, the control unit 21 controls the second upper advance/retreat drive mechanism 22a and the second vertical-movement drive mechanism 20 to advance the second upper hand 14 to the processing unit 3. Specifically, the second upper hand 14 is linearly and relatively moved on the second base stand 18 to approach the processing unit 3, thus being horizontally moved to a position slightly lower than the substrate W in the processing unit 3.

Subsequently, the control unit 21 controls the second upper advance/retreat drive mechanism 22a and the second vertical-movement drive mechanism 20 to move the second upper hand 14 to a slightly upper position. This allows the second upper hand 14 to hold the substrate W, and thereafter, the second upper hand 14 is retreated. That is, after the substrate W in the processing unit 3 has been held by the second upper hand 14, the second upper hand 14 is linearly and relatively moved on the second base stand 18 to be away from the processing unit 3, thus being moved with maintaining the horizontal posture. This returns the second upper hand 14 to its initial position. Thus, the processed substrate W in the processing unit 3 is transferred to the second upper hand 14, whereby the main transfer robot CR can carry out the substrate W from the processing unit 3.

Next, the control unit 21 controls the second vertical-movement drive mechanism 20 to put the second lower hand 15 in a posture opposed to the processing unit 3 from which the substrate W has been carried out, as shown in FIG. 6(b). That is, the second lower hand 15 holding an unprocessed substrate W faces the processing unit 3. Then, the control unit 21 controls the second lower advance/retreat drive mechanism 22b to advance the second lower hand 15 to the processing unit 3. Specifically, the second lower hand 15 is linearly and relatively moved on the second base stand 18 to approach the processing unit 3, thus being moved with maintaining the horizontal posture.

Subsequently, the control unit 21 controls the second lower advance/retreat drive mechanism 22b and the second vertical-movement drive mechanism 20 to move the second lower hand 15 to a slightly lower position. After the substrate W has been transferred to the processing unit 3, the second lower hand 15 is retreated. This allows the unprocessed substrate W held by the second lower hand 15 to be transferred to the processing unit 3, whereby the main transfer robot CR can carry the substrate W in the processing unit 3.

Accordingly, there is conducted the second substrate transfer step of receiving/transferring a substrate W from/to a processing unit 3 by advancing/retreating the second upper hand 14 and the second lower hand 15 to the processing unit 3.

Next, the control unit 21 controls the second pivot mechanism 19 and the second vertical-movement drive mechanism 20 to put the main transfer robot CR in a posture such that each of the second upper hand 14 and the second lower hand 15 is opposed to the indexer robot IR, as shown in FIG. 6(*c*). In this state, transfer of a substrate W between the indexer robot IR and the main transfer robot CR is conducted. After the transfer, the control unit 21 controls again to put the main transfer robot CR in the posture such that each of the second upper hand 14 and the second lower hand 15 is opposed to any of the processing units 3, so that the carrying-in/carrying-out operation of a substrate W with respect to a processing unit 3 and the transfer of a substrate W between the indexer robot IR and the main transfer robot CR are repeated.

The transfer between the indexer robot IR and the main transfer robot CR is conducted while the indexer robot IR faces the main transfer robot CR in a position opposed to the cassette 4 from which the indexer robot IR has carried a substrate W out, as shown in FIG. 6(*c*).

The control unit 21 controls the second upper advance/retreat drive mechanism 22*a* to advance the second upper hand 14 holding a processed substrate W toward the indexer robot IR, as shown in FIG. 6(*d*). On the other hand, the control unit 21 controls the first upper advance/retreat drive mechanism 21*a* to advance the first upper hand 7 toward the main transfer robot CR. The control unit 21 advances each of the first and the second upper hands 7, 14 to the middle position therebetween in the horizontal direction. This provides a positional relationship such that the second upper hand 14 is located in a position slightly higher than the first upper hand 7 and that these hands mutually mesh without interfering each other in plan elevation.

Next, the control unit 21 controls the second vertical-movement drive mechanism 20 to lower the second upper hand 14, so that the substrate W held by the second upper hand 14 is directly transferred to the first upper hand 7. Thereafter, the control unit 21 controls the first upper advance/retreat drive mechanism 21*a* to retreat the first upper hand 7, so that the hand 7 returns to its initial position. The control unit 21 also controls the second upper advance/retreat drive mechanism 22*a* to retreat the second upper hand 14, so that the hand 14 returns to its initial position.

Further, the control unit 21 controls the first lower advance/retreat drive mechanism 21*b* to advance the first lower hand 8 holding an unprocessed substrate W toward the main transfer robot CR. On the other hand, the control unit 21 controls the second lower advance/retreat drive mechanism 22*b* to advance the second lower hand 15 of the main transfer robot CR toward the indexer robot IR. The control unit 21 advances each of the first and the second lower hands 8, 15 to the middle position therebetween in the horizontal direction. This provides a positional relationship such that the first lower hand 8 is located in a position slightly higher than the second lower hand 15 and that these hands mutually mesh without interfering each other in plan elevation.

Next, the control unit 21 controls the second vertical-movement drive mechanism 20 to raise the second lower hand 15, so that the substrate W held by the first lower hand 8 is directly transferred to the second lower hand 15. Thereafter, the control unit 21 controls the first lower advance/retreat drive mechanism 21*b* to retreat the first lower hand 8, so that the hand 8 returns to its initial position. The control unit 21 also controls the second lower advance/retreat drive mechanism 22*b* to retreat the second lower hand 15, so that the hand 15 returns to its initial position.

Accordingly, there is conducted the third substrate transfer step of receiving/transferring a substrate W between the indexer robot IR and the main transfer robot CR, in a position where the indexer robot IR is opposed to each of a plurality of cassettes 4.

As described above, since the indexer robot IR and the main transfer robot CR are disposed close to each other, transfer of a substrate W between the indexer robot IR and the main transfer robot CR can be conducted at a position where the indexer robot IR is opposed to the cassette 4 from which the indexer robot IR has carried out a substrate W, without moving the indexer robot IR to a given substrate transfer position determined for the transfer. The transfer therebetween may also be conducted not only in a position where the indexer robot IR is opposed to the cassette 4 from which the indexer robot IR has carried out an unprocessed substrate W but also in a position where the indexer robot IR is opposed to a different cassette 4.

According to this embodiment having the arrangement mentioned above, vertical lamination of a plurality of processing units 3 eliminates a processing unit between the main transfer robot CR and the indexer robot IR, thereby disposing the indexer robot IR and the main transfer robot CR so as to be adjacent to each other when viewed from the front direction of the substrate processing apparatus 100. This enables reduction in the distance between the indexer robot IR and the main transfer robot CR.

This reduction allows the indexer robot IR to conduct transfer of a substrate W in any position opposed to a cassette 4, without moving the indexer robot IR to a given substrate transfer position.

Thus, during transfer of a substrate W, a time for moving the indexer robot IR to the given substrate transfer position determined for the transfer can be saved. That is, the transfer load on the indexer robot IR can be lightened, thereby enabling improvement in production efficiency of the entire substrate processing apparatus.

In the foregoing, an embodiment of the present invention has been discussed, but the present invention can also be embodied in a different manner. For example, in the embodiment described above, the description has been made of an embodiment of laminating processing units in two layers of the upper and lower side layers. However, the processing units may be laminated in two or more layers. Further, the processing units may be disposed in a planar arrangement instead of a vertical lamination.

In the embodiment described above, the substrate processing apparatus comprising a plurality of processing units has been discussed, but the present invention is also applicable to a substrate processing apparatus comprising a single processing unit.

In the embodiment described above, the substrate processing apparatus comprises a main transfer robot as a second transfer mechanism having the vertical axis 19*c* (which is a rotation center of the second upper hand 14 and the second lower hand 15), fixed in a predetermined position. However, the rotation center thereof may not be fixed in a predetermined position. For example, the entire main transfer robot may be adapted to horizontally move in parallel to the indexer robot as the first transfer mechanism or horizontally move in a direction perpendicular to the moving direction of the indexer robot thereof.

Further, the description has been made of an embodiment in which each of the indexer robot and the main transfer robot is of the double-hand type having a pair of substrate holding hands. However, the indexer robot and/or the main transfer robot may be a robot of the single-hand type having only one hand.

Further, in the embodiment described above, transfer of a substrate is conducted by mutually advancing/retreating the substrate holding hand of the indexer robot and the substrate holding hand of the main transfer robot. However, the transfer may be conducted by advancing/retreating one of these hands while the other hand is retreated.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application corresponds to Japanese Patent Application Serial No. 2005-280612 filed on Sep. 27, 2005 with the Japanese Patent Office, the disclosure of which is incorporated herein by reference.

What is claimed is:

1. A substrate processing apparatus, comprising:
a cassette placing table for receiving a plurality of cassettes for each housing a substrate, placed in a predetermined arrangement direction;
a first transfer mechanism, having a first substrate holding hand which is capable of advancing and retreating with respect to a cassette placed on the cassette placing table, for transferring a substrate with respect to the cassette with the first substrate holding hand;
a substrate processing unit for executing a predetermined process on a substrate;
a second transfer mechanism, having a second substrate holding hand which is capable of advancing and retreating with respect to the first transfer mechanism and the substrate processing unit and which is pivotable about a vertical axis, for transferring a substrate with respect to the first transfer mechanism and the substrate processing unit with the second substrate holding hand, the vertical axis being fixed in a predetermined position at all times;
a moving mechanism for moving the first transfer mechanism in the predetermined arrangement direction; and
a control unit for controlling transfer of a substrate between the first transfer mechanism and the second transfer mechanism in all positions where the first transfer mechanism is opposed to the plurality of cassettes, wherein
the control unit is programmed to select any one of a plurality of substrate transfer positions respectively opposed to the plurality of cassettes placed on the cassette placing table, to control the moving mechanism so as to move the first transfer mechanism to the selected substrate transfer position, and to cause the first and second transfer mechanisms to transfer a substrate between the first and second transfer mechanisms with the first transfer mechanism positioned at the selected substrate transfer position,
the first and second transfer mechanisms are arranged to transfer a substrate at a position opposed to any one of the plurality of cassettes from which the first transfer mechanism has carried out the substrate.

2. A substrate processing apparatus according to claim 1, wherein the first transfer mechanism further includes a first hand pivot mechanism for pivoting the first substrate holding hand to a posture opposed to a cassette placed on the cassette placing table and to a posture opposed to the second transfer mechanism, and
the control unit controls the first hand pivot mechanism, thereby controlling the first substrate holding hand to be in the posture opposed to the second transfer mechanism when a substrate is transferred between the first transfer mechanism and the second transfer mechanism.

3. A substrate processing apparatus according to claim 1, wherein the control unit controls the first and second transfer mechanisms such that the substrate is transferred between the first and second transfer mechanisms with both the first and second substrate holding hands being advanced.

4. A substrate processing apparatus according to claim 1, wherein the substrate processing unit is disposed on a side opposite to the first transfer mechanism with respect to the second transfer mechanism.

5. A substrate processing apparatus according to claim 1, comprising a plurality of substrate processing units, wherein the plurality of substrate processing units are vertically laminated.

6. A substrate transfer method, comprising:
a first substrate transfer step of transferring a substrate between a first substrate holding hand provided in a first transfer mechanism and a predetermined cassette among a plurality of cassettes for each housing a substrate, by advancing and retreating the first substrate holding hand to and from the predetermined cassette;
a second substrate transfer step of transferring a substrate between a second substrate holding hand provided in a second transfer mechanism and a substrate processing unit for executing a predetermined process on a substrate, by advancing and retreating the second substrate holding hand to and from the substrate processing unit; and
a third substrate transfer step of transferring a substrate between the first substrate holding hand and the second substrate holding hand, with the second substrate holding hand opposed to the first transfer mechanism located in a position opposed to the predetermined cassette among the plurality of cassettes, by pivoting the second substrate holding hand of the second transfer mechanism about a vertical axis which is fixed in a predetermined position at all times; wherein
the plurality of cassettes are placed in a predetermined arrangement direction,
the first transfer mechanism is movable in the predetermined arrangement direction, and
the third substrate transfer step includes the steps of:
selecting any one of a plurality of substrate transfer positions respectively opposed to the plurality of cassettes,
moving the first transfer mechanism to the selected substrate transfer position, and carrying a substrate out of the corresponding said cassette with said first transfer mechanism, at the selected substrate transfer position, and
transferring said substrate between the first and second transfer mechanisms with the first transfer mechanism positioned at the selected substrate transfer position, opposed to said corresponding cassette from which the first transfer mechanism has carried out the substrate.

7. A substrate transfer method according to claim 6, wherein the first substrate holding hand is pivotable to a posture opposed to a cassette placed on the cassette placing table and to a posture opposed to the second transfer mechanism, and
the third substrate transfer step further includes the step of pivoting the first substrate holding hand to be in the posture opposed to the second transfer mechanism.

* * * * *